United States Patent [19]

Rose et al.

[11] Patent Number: 4,804,852
[45] Date of Patent: Feb. 14, 1989

[54] TREATING WORK PIECES WITH ELECTRO-MAGNETICALLY SCANNED ION BEAMS

[75] Inventors: Peter H. Rose, Rockport; Marvin Farley, Ipswich; Lee Grodzins, Lexington, all of Mass.

[73] Assignee: Eaton Corporation, Cleveland, Ohio

[21] Appl. No.: 32,513

[22] Filed: Mar. 30, 1987

Related U.S. Application Data

[63] Continuation-in-part of Ser. No. 823,616, Jan. 29, 1987, abandoned.

[51] Int. Cl.⁴ .............................................. G21K 5/02
[52] U.S. Cl. .............................. 250/492.1; 250/492.2; 250/398
[58] Field of Search .................. 250/398, 492.21, 492.2, 250/305

[56] References Cited

U.S. PATENT DOCUMENTS

| | | | |
|---|---|---|---|
| 3,245,895 | 4/1966 | Baker et al. | 250/492.21 |
| 3,676,693 | 7/1972 | Guernet | 250/396 R |
| 3,689,766 | 9/1972 | Freeman | 250/396 ML |
| 3,778,626 | 12/1973 | Robertson | 250/492 A |
| 4,011,449 | 3/1977 | Ko et al. | 250/309 |
| 4,118,630 | 10/1978 | McKenna et al. | 250/492 B |
| 4,234,797 | 11/1980 | Ryding | 250/492 B |
| 4,258,266 | 3/1981 | Robinson et al. | 250/492 A |
| 4,276,477 | 6/1981 | Enge | 250/398 |
| 4,283,631 | 8/1981 | Turner | 250/398 |
| 4,367,411 | 1/1983 | Hanley et al. | 250/492.2 |
| 4,383,178 | 5/1983 | Shibata et al. | 250/441.1 |
| 4,421,988 | 12/1983 | Robertson et al. | 250/398 |
| 4,517,465 | 5/1985 | Gault et al. | 250/492.2 |

FOREIGN PATENT DOCUMENTS

| | | |
|---|---|---|
| 123639 | 8/1982 | Japan. |
| 230242 | 12/1984 | Japan .............................. 250/492.21 |
| 2098793 | 11/1982 | United Kingdom. |

OTHER PUBLICATIONS

Ryssel and Glawischnig, Ion Implantation Techniques, Springer-Verlag, pp. 1–20, 1982.

*Primary Examiner*—Carolyn E. Fields
*Assistant Examiner*—John A. Miller

[57] ABSTRACT

A magnetic scanning technique for sweeping an ion beam across an implantation target, such as a semiconductor wafer, by means of modulating the energy of a beam and directing it through an analyzer magnet, which effects a scanning motion of the beam of constant intensity, the wave form for the modulation being selected to take into account that the areal density of the ions in the scanned beam varies dependently with the amount of displacement of the beam from a reference point. An ion scan can be obtained in which the ions travel in parallel paths and enter the target at a constant desired angle throughout the scan. The technique is applicable to targets held stationary or rotated during implant. By employing predetermined modulation wave forms which are adapted to other parameters of the selected system, a desired scan distribution of ions can be obtained, for instance a uniform distribution in X and Y directions. As applied to a semiconductor wafer rotated on a disc past the ion beam, the technique solves the problem of compensating for the fact that the area of a ring on the spinning disc depends linearly on the radius of the ring. The technique makes use of the properties of ion beams in uniform magnetic fields to produce a radial dependence of the density of the ion beam on the wafer which precisely cancels the radial dependence of circumferential length as a function of radius. The magnetic scanning technique is well adapted for use with large wafers held on rotating discs and has advantages over the conventional techniques of either electrostatic or mechanical scanning. The technique is readily adapted to a variety of other wafer transport systems including rotating conveyors and linear transports.

35 Claims, 7 Drawing Sheets

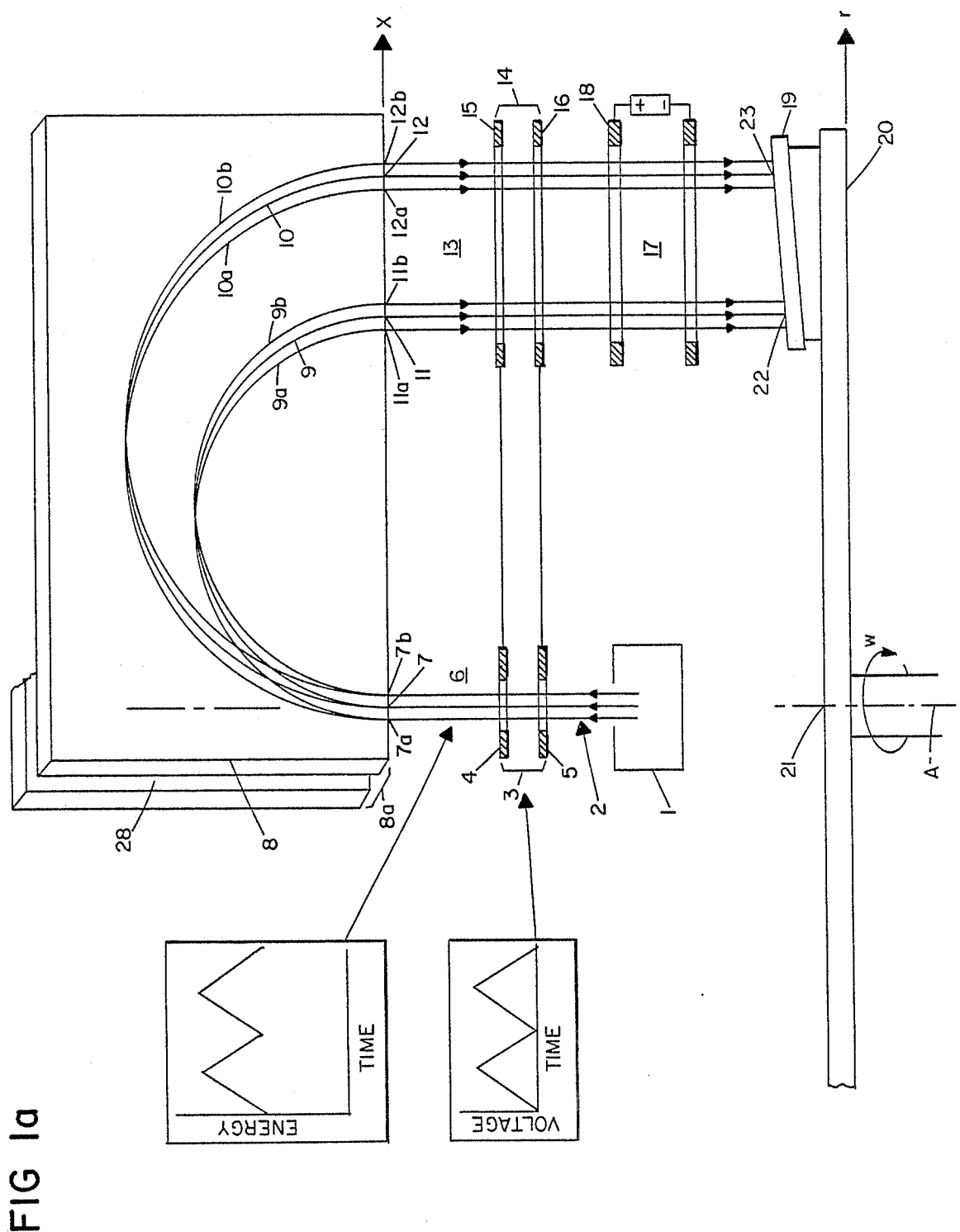

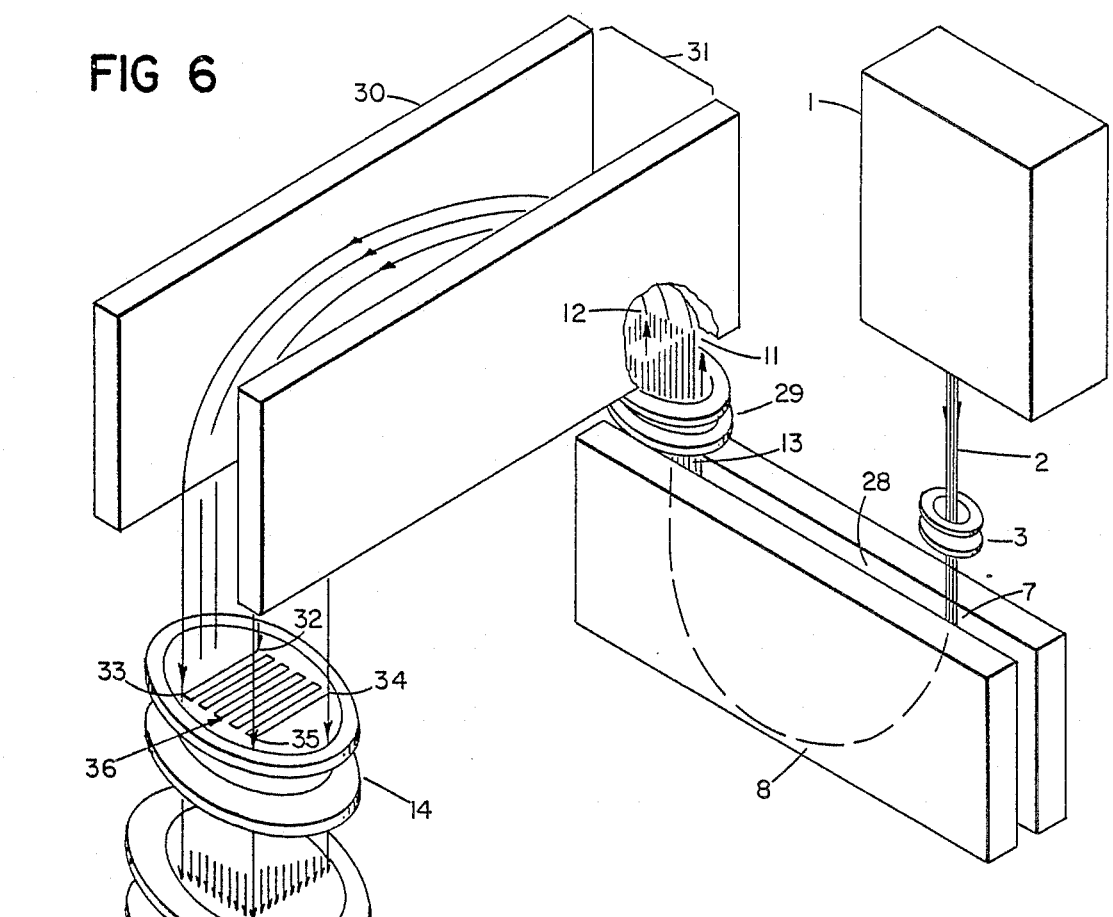
FIG 6
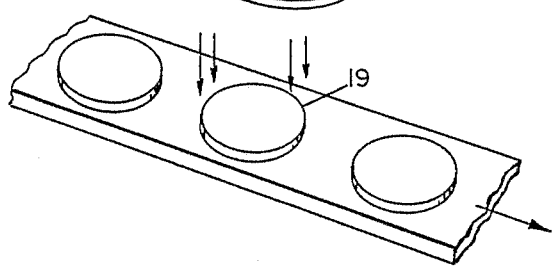
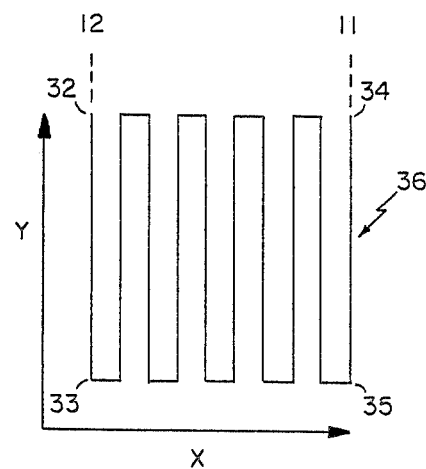
FIG 6a

TREATING WORK PIECES WITH ELECTRO-MAGNETICALLY SCANNED ION BEAMS

This application is a continuation-in-part application of U.S. Ser. No. 823,616, now abandoned, filed Jan. 29, 1987.

BACKGROUND OF THE INVENTION

The doping of electrically active elements into semiconductors is at this time done almost exclusively by injecting the elements into the semiconductor material by means of instruments known as ion implanters. Ion implanters create highly controlled beams of the desired ions and drive these ions at relatively high energy into the semiconductor wafers so as to dope the wafers in a uniform manner, at a controlled depth and temperature, and with well-regulated dose strengths. The functional components of ion implanters are: a source, called the ion source, of the element to be implanted; an acceleration and control section whose function is to produce a beam of the homogeneous ions having the desired energy and intensity profile; a target system which holds the semi-conductor wafers which will be implanted; and a wafer handling system which loads fresh wafers into the target system and unloads the implanted ones. The wafers are generally much larger than the beam size so that it is necessary to also have a scanning system which either scans the beam over the wafers or mechanically scans the wafers across the beam. The present invention is directed towards the scanning function of the ion implantation system. It specifically concerns the technique for scanning the ion beam across wafers which are rotated or otherwise conveyed in front of the ion beam.

Some early proposals for scanning are given in Freeman, U.S. Pat. No. 3,689,766. There the beam is scanned by varying the energy of the beam and passing it through a magnetic field. Reduction in variation of the ion beam intensity was to be achieved by sensing the ion beam current and feeding back that signal to control the amplitude of the sweep voltage applied to the beam.

The scanning of the beam across the semi-conductor wafer has continued to be of concern throughout the evolution of the modern ion implanter. The problems of scanning get more severe as the wafers get larger. The 3 inch diameter wafers of a decade ago have been successively replaced with 4 inch, 5 inch, and 6 inch wafers; 8 inch diameter wafers are now becoming standard. A common requirement is to maintain spatial uniformity of the implanted ions over large surfaces even as the criteria for uniformity become more stringent; specificaions of <1% non-uniformities of implant dose over the wafer area are now common. Examples of present day scanning techniques are given in Ryssel and Glawischnig, *Ion Implantation Techniques*, Springer-Verlag, pp. 1-20 (1982), see especially pages 4 and 9.

Spinning Disc Scanning

To implant wafers, manufacturers have adopted the rotating disc holding system in which the semiconductor wafers are held on the face of a large disc which is rotated in front of the beam. When, as is normally the case, the beam is much smaller than the diamer of the wafers, the beam must be scanned orthogonally to the circular motion, that is, there must be a scan across the wafer in the radial direction of the disc. A central problem which must then be overcome to produce a spatially uniform implant over the face of the wafer is that, in each revolution of the disc, the area of the wafer furthest from the center of the rotating disc is swept more rapidly than the area closest to the center of rotation. To obtain a uniform implant the scanning must compensate for this radial dependence.

Radial scanning can be done by electromagnetic or mechanical techniques. A parallel beam, i.e. with rays having a constant angle, is recognized as a necessary feature for uniform implantaton dose density, or to avoid "channeling". Magnetic scanning of the wafers, for instance, as shown in *Ion Implantation Techniques*, supra, P. 9 and in Enge, U.S. Pat. No. 4,276,477, has involved a number of drawbacks and complexities to achieve a parallel beam. Mechanical scanning of the wafers across a stationary beam maintains the constancy in angle between the beam and the wafer-face in a natural way. Several techniques have been used to correct for the radial dependence of the circumferential length when the wafers are mounted on a spinning disk. When magnetic scanning is employed, a separate microcomputer has been used to compensate for radial deviaions, *Ion Implantation Techniques, supra, p.* 10. For mechanical scanning, Robertson, U.S. Pat. No. 3,778,626, varies the radial velocity in inverse proportion to measured radial position of the wafer with respect to the beam. Ryding, U.S. Pat. No. 4,234,797, by means of a slot in the rotating disc, samples the charge per unit area deposited by the beam in each revolution, and uses the sample values to vary the radial velocity of the disc so as to maintain a contant charge per unit area over the entire scan. Mechanical scanning of the rotating disc across the beam is, by its nature, relatively slow compared to electromagnetic scanning. And the technical difficulties associated with mechanical scanning generally increase as the wafer and hence the wafer-holding disc increase in size.

Electromagnetic Scanning

Electromagnetic scanning whether for radial scanning for a spinning disc system or for x or y scanning of a raster can be done much more rapidly than mechanical scanning, allowing more back-forth motions per implant. In principle, this has several advantages over mechanical scanning, but as presently practiced also has serious drawbacks. Among the advantages in respect of spinning disc arrangements are first, of course, one eliminates the need for the precision mechanical system needed for the highly controlled radial scan; second, the rapid radial scanning reduces the problems of wafer heating; third, the ability to control the rate of radial scan over a wide range of times makes practical the use of the full intensity of the beam over a wide range of total implant dose, without compromising the uniformity of the dose density. However, in the electrostatic or magnetic methods used until now, the problems in controlling the beam over the full scan get rapidly more severe as the wafers get larger; in particular, it becomes increasingly difficult to maintain a constant angle entry of the beam into the wafer.

SUMMARY OF THE INVENTION

The present invention uses electromagnetic scanning with an analyzer magnet to produce a scanned beam which enters the wafers at a fixed angle, independent of the size of the wafer. The technique can be employed to produce the proper radial dependence of ion dose to compensate for radial changes of circumferential area in a spinning disc system, and has advantages when applied to other techniques for scanning wafers. An ion implanter is provided in which an ion beam is electromagnetically scanned across an implantation target by first modulating the energy of the beam in accordance with a predetermined, cyclical wave form, and passing the thus-modulated beam through an analyzer magnet and thence to the target.

According to a broad aspect of the invention, under conditions of operation in which the intensity of the ion beam is unchanging, the wave form of the modulator voltage is adapted to take into account the non-linear relationship between the deflection of the beam by the magnetic field and the beam modulation energy of the beam, so as to produce a uniform areal distribution of the number of ions implanted into the target. Where a uniform magnetic field of constant magnitude is employed, acting upon an energy-modulated beam of constant intensity, the wave form is selected to take into account that the areal density of the ions in the scanned beam is directly proportional to the amount of the displacement.

In embodiments with ions of uniform energy before modulation and directed normally to the entrance face of the magnet, the scanned ions can emerge from the exit face in parallel paths without correction, and can enter the target at a constant angle over the sweep of the beam.

In embodiments employing a spinning disc, the direction of the scanning motion achieved with the analyzer magnet is arranged radially with respect to the disc to uniquely achieve compensation for radial changes of circumferential area. In embodiments employing a pair of analyzer magnets set orthogonally to one another, the beam energy modulation techniques can achieve a uniform X-Y scan.

DRAWINGS

FIG. 1a is a view similar to FIG. 1 showing a beam of finite dimension and parallel output rays corresponding to parallel input rays;

FIG. 6 is a schematic view of a system employing two orthogonal 180° analyzer magnets for achieving electromagnetic x-y scan of implant upon a wafer; and FIG. 6a is a representation of the raster scan produced by the system of FIG. 6.

EMBODIMENT OF FIG. 1

Figure 1:
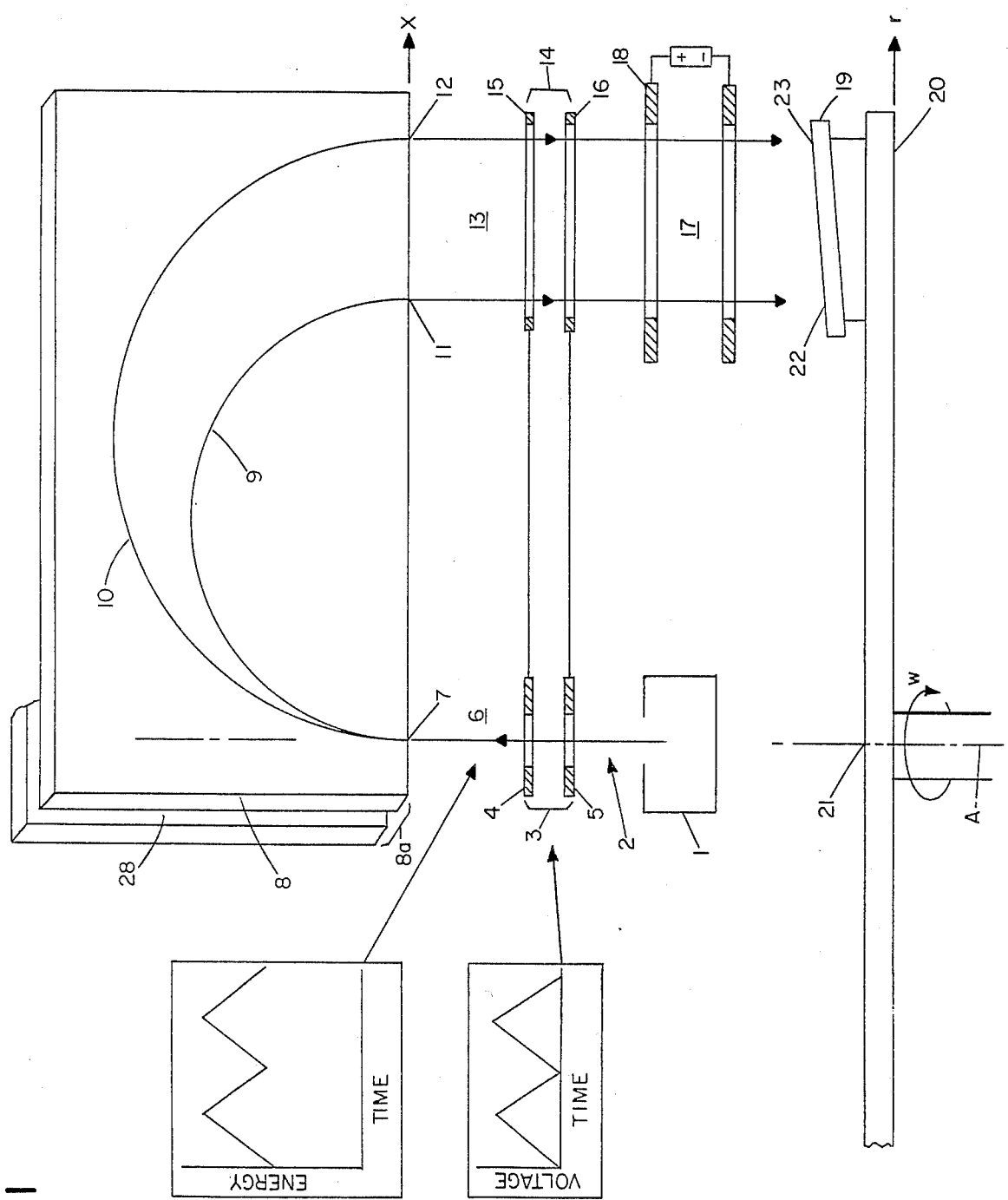
FIG. 1 is a diagram of an embodiment of a spinning disc ion implanter employing the scanning technique of the invention.

Referring to the embodiment of FIG. 1, the basic technique of the invention is uniquely applied to acomodate the 1/R dependence of a spinning disc scanning an ion beam 2 entering at 180° magnet 8 of constant and uniform magnetic field strength at position 7, (hereafter, position 7 will mean the centroid of the beam and may be referred to as the magnet entry point). In order to take into account the fact that the areal density of the ions in the energy-modulated, magnetically deflected beam is directly proportional to the displacement of he beam, and to accomodate the 1/R dependence, the energy of the ions of charge q is modulated by an accelerations gap 3 in which the voltage, V, varies linearly with time in a triangular wave form as shown in the inset to FIG. 1. (We emphasize that the energy modulation is not used as a possible means of controlling the beam intensity on the basis of sensed ion beam current. In the present invention, the ion beam current is assumed to be kept constant by methods well known in the art, not discussed here.)

The energy versus time profile over one period T can be written (using in every instance throughout the differential function "d" even when describing discrete changes in quantities that occur in the illustrated incremental implementation of the invention):

$$E = q(dV/dt)t + E_o, \quad 0 \leq t \leq T/2$$

$$E = q(dV/dt)(T-t) + E_o, \quad T/2 \leq t \leq T \tag{1a}$$

the energy change per unit time is constant, of magnitude $k_1$; that is, $$dE/dt = q\, dV/dt = k_1, \quad 0 \leq t \leq T/2$$

$$dE/dt = q\, dV/dt = 31\, k_1, \quad T/2 \leq t \leq T \tag{1b}$$

The intensity of particles in the ion beam 2, $dN/dt = I$, is constant, so that the number of particles per unit energy interval is also constant:

$$dN/dE = (dN/dt)(dt/dE) = I/k_1 \tag{2}$$

where the sign of $k_1$ has been dropped since it has no significance, for present purposes.

The magnetic field produced by the magnet 8 in this embodiment is also constant in value throughout its gap 28 and is directed out of the plane of FIG. 1. The magnetic field H produces a force on the ions causing the ions to move in the arc of a circle of radius r which depends on the energy, E, the strength of the magnetic field, H, the ion's mass, m, and charge, q, according to the well-known relationship, $$(H^2 r^2 q^2)/2m = E \tag{3a}$$

The bend of the particle trajectores by the magnetic field is 180°, so the distance $x = 2r$, where x is the distance along the face of the magnet 8 from the point where the beam of energy E enters the magnet. Thus Equation 3a can be written in terms of x $$(H^2 x^2 q^2)/8m = E \tag{3b}$$

The radius of the trajectory of an ion of a given mass and ionic charge, which moves in a constant and uniform magnetic field, varies as the square root of the energy. Ions entering the magent at point 7, perpendicular to the face of the magnet, represented schematically at 8a, will be bent, according to equation 3, through 180° so as to emerge perpendicular to the magnet face into region 13.

It is the unique property of a 180° deflection magnet of constant strength that all parallel rays entering the magnet gap perpendicular to the magnet entry face will emerge, after the 180° deflection, again parallel and perpendicular to the magnet exit face. Such rays suffer no focusing by the fringe field on entering or leaving the magnet. This unique property is illustrated in FIG. 1a, which shows a beam of finite width entering the magnet face from point 7a to 7b; point 7 is the mean of the finite beam. The ions of lowest energy are bent through the smallest arc indicated by trajectories 9a and 9b; the corresponding trajectories of the highest modulation energy are indicated by 10a and 10b. Trajectory 9a which entered the magnet gap at point 7a, leaves the magnet gap at point 11a; trajectory 10a which also entered the magnet gap at point 7a leaves the magnet gap at point 12a. The bundle of rays of lowest energy leave the magnet from positions 11a to 11b; those of highest energy leave from points 12a to 12b; and all rays are parallel to each other.

The rate of change of the position x with respect to E is found directly from Equation 3b. For convenience of later use, we write the invese of this ratio, $$dE/dx = (H^2 q^2 x)/4m = k_2 x \qquad (4)$$

where $k_2$ is a constant for a given ion in a uniform magnetic field that is constant in time.

From Equations 2 and 4 we see that the intensity of the ions as a function of distance x along the exiting surface, dN/dx, varies directly with the distance x.

$$dN/dx = (dN/dE)(dE/dx) = (I\, k_2/k_1)x \qquad (5)$$

This is the desired intensity distribution to compensate for the radial dependence of area in a spinning disc. To make the compensation precise it is necessary for the disc to be properly positioned with respect to the magnet entry point 7, and the ratio of wafer size to the position of the waver on the disc must have a proper relationship with the positions 11 and 12 of the beam exiting the magnet position. The requirements can be readily realized in practice as the following derivation shows. We begin the analysis with the condition for uniform implantation on the rotating disc.

We require, at all points of the wafer, a constant implant dose density, dN/dA, where N is the number of ions implanted and A is the area. Without loss of generality we will take dN to be the number of ions implanted in one revolution of the disc, dA to be the area the beam strikes in one revolution, and dt, in Equations 1 and 2 to be the time for one revolution of the disc. Thus dN/dt is again the particle beam current, assumed constant.

If the beam has a radial extent dr, then in one revolution, $$dN/dA = (1/2\pi r)\, dN/dr \qquad (6)$$

To obtain a constant dose density dN/dA, it is necessary for dN/dr to vary linearly with r in order to cancel the radial dependence in the denominator of Equation 6. To effect that cancellation, it is necessary that the center 21 of the rotating disc 20 be positioned so that x, the exiting distance from 7 along the magnet face, corresponds to r, the radial distance of the beam with respect to the disc. That is, $$x = k_3 r \qquad (7)$$

where $k_3$ is a constant. Thus $$dN/dr = (dN/dx)(dx/dr) = k_3\, dN/dx. \qquad (8)$$

Substituting Equation 5 into Equation 8 yields the desired dose implanted per unit increment of radius on the wafer $$dN/dr = I k_3 k_2/k_1\, x. \qquad (9)$$

Finally, combining Equation (9) with Equation (6) gives the dose per unit area per revolution of the disc, $$\begin{aligned} dN/dA &= (x/2\pi r)(I\, k_2 k_3/k_1) \\ &= I k_2 k_3^2/(2\pi k_1) \end{aligned} \qquad (10)$$

which is a constant, independent of the radius.

Thus, the simple linear voltage scan at the input to the magnet 8 results in a uniform ion implantation over the entire diameter of the wafer.

It must be appreciated that certain broader aspects of the present invention can be adapted to workpieces which move under the beam in almost any manner. To emphasize this important point, consider the expanded equation for the dose per unit area, dn/dA, on the workpiece. We write, using notations above, $$dN/dA = (dN/dt)(dt/dE)(dE/dx)(dx/dr)(dr/dA) \qquad (11)$$

which can be simplified, according to the above discussion $$dN/dA = (k_2 I x/k_1)(dt/dE)(dx/dr)(dr/dA). \qquad (12)$$

The ratio dx/dr, which is the ratio of the rate of change of the coordinate of the beam with respect to the magnet, to that of the beam with respect to the wafer, and dr/dA, the rate of change of the radial coordinate of the wafer with respect to its area, will depend on the specific geometry of the implanter components. For every product function (dx/dr)(dr/dA) it is always possible to track (x)(dx/dr)(dr/dA) by the appropriate function of voltage modulation dV/dt so that (dN/dA) is a constant independent of time. The voltage wave form on the demodulator will again be the same as that on the modulator but with opposite phase. Two examples will make the point clear.

A. Linear wafer motion.

If the wafers are moved under the beam linerly in the direction orthogonal to the direction of the beam scan, i.e., the wafers are stationary with respect to the scan direction, then a linearly modulated wave form would result in a non-uniform implant density of the beam energizing from the magnet. It is emphasized that this non-uniformity occurs when the beam intensity, in particles per second, is constant. That is, for a constant beam intensity a modulation of equal voltage increments in equal time increments would lead to an implant dose density which increases linearly with x, the distance from the magnet entry point. To produce an implant which is uniform across the wafer the modulation voltage wave form is varied as the square of the time. In differential form, $dV/dt = CV^{\frac{1}{2}}$ between the limits of $V_{min}$ and $V_{max}$.

B. Rotational wafer moton, generally.

Figure 2:
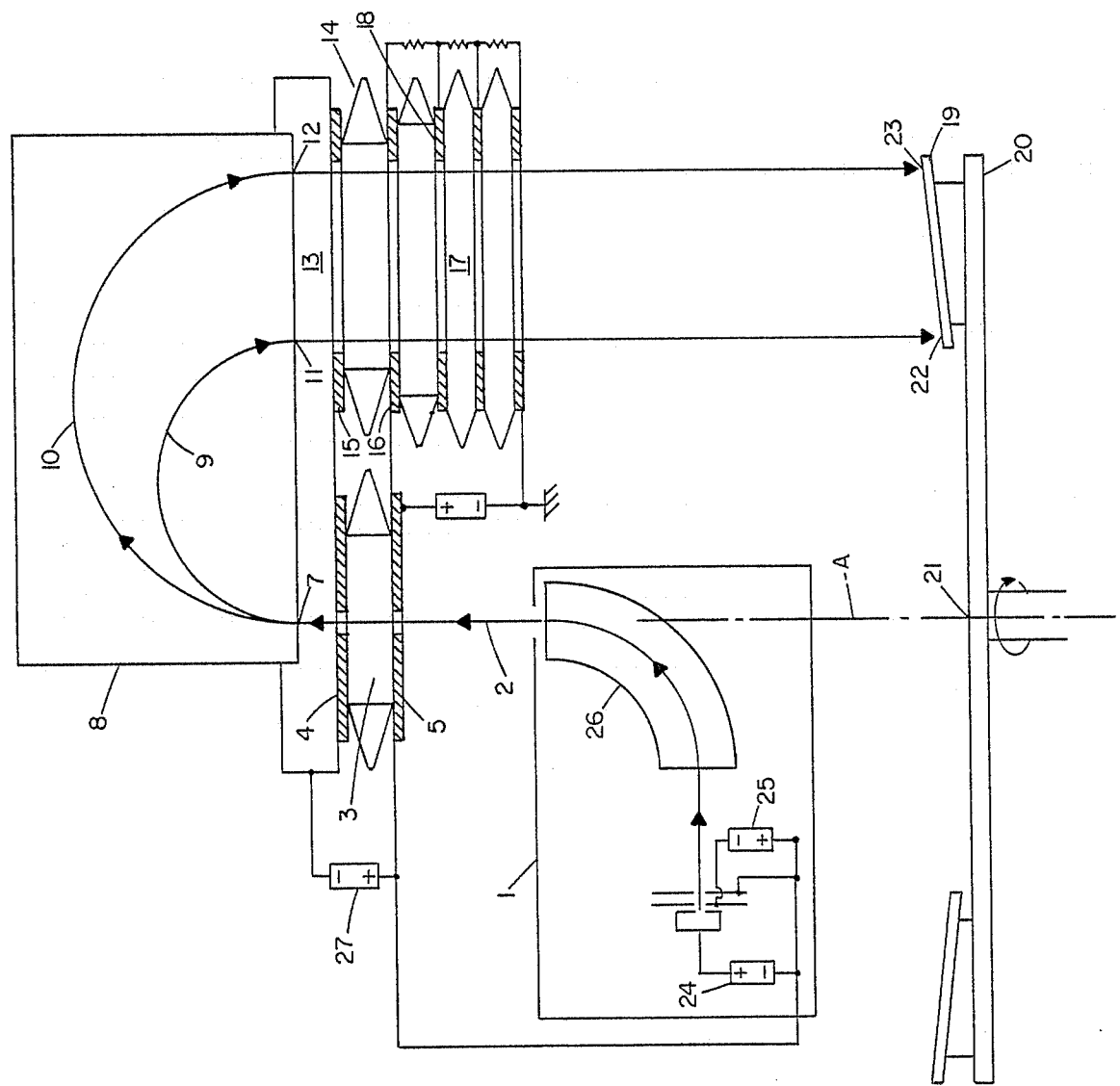
FIG. 2 shows details of a specific implementation of the implanter of FIG. 1.

Rotational motion of the wafer-holding disc, where the disc, whose surface is parallel to the magnet face as in FIG. 1 and FIG. 2, rotates about an axis a distance D from the point of entry on the magnet of the centroid of the beam. A special solution to this problem is described below in terms of a post-acceleration lens designed as an image inverter. A more general solution is to vary the wave form on the modulator so that $dV/dt = x/(D-x)$, where x is again the distance between the entrance point 7 and the exit point 11 or 12, FIG. 2, of the beam relative to the magnet. (It will be appreciated that in all these applications, the 180° magnet deflection of FIG. 1 results in parallel rays emerging perpendicular to the magnet face for all rays of a finite beam which enter the magnet perpendicular to the magnet face, see e.g. FIG. 1a.)

Two additional provisions may be made to accommodate the needs of the industry. First, the semiconductor industry at present generally requires that the beam have a higher energy han one would want to use in the scanning apparatus described above; that is, a final acceleration of the beam is generally desired to meet the needs of ion implantation. Second, the semiconductor industry at present also generally desires that the beam energy be homogeneous, to at least a few percent for most industrial implants; that is, the large energy spread of the modulated beam usually must be demodulated out. Both these needs can be readily taken care of:

To compensate for the change in energy caused by the scanning potential 3 it is only necessary to place a deceleration gap 14 following the exit from the magnet. The gap electrodes are connected so that the acceleraton at the input to the magnet results in a corresponding decelleration at the output; that is, electrode 15 should be connected to electrode 4 and electrode 16 should be connected to electrode 5. The shift in energy caused by the finite transit time of the ions through the magnet is negligible.

Post-acceleration is a standard element in ion-implantation systems. In the method described here, it is preferred to use an acceleration lens 18 which is wide in the scan direction but fairly narrow in the direction perpendicular to the scan. Experience shows that such an oval lens can be designed to focus only in the narrow direction, i.e., perpendicular to the plane of the paper, so as to preserve the directionality, in the plane of the paper, of the beam through the lens. Thus the beam emerging from the magnet in region 13 will travel through region 17 with little deflection in the plane of the paper; trajectory 10, which strikes the wafer 19 at position 23, will do so at the same angle as trajectory 9 strikes the wafer at its corresponding point 22.

In respect of accommodating the 1/R dependence which results when a target wafer is swept past the beam on the arc of circle of radius R whose rotational axis is parallel to the beam, it should be appreciated that certain features of this invention are of special emphasis for easy implementation with presently available techniques. These features are: (1) A magnetic deflection which satisfies Equation 4 and where the beam emerges perpendicular to the magnet face at all energies. (2) A voltage modulation of the beam, as, for example, in Equation 1, in which the voltage increments are carried out in equal time increments, in order to produce a beam density out of the magnet which varies linearly with the total deflection. (3) A rotating carrier whose axis of rotation is positioned to cause the 1/R variation of area on the wafer to correspond to the 1/R variation in the deflection of the beam.

These features allow significant flexibility in choosing key parameters such as the magnet and carrier sizes and the modulation period.

It should be noted that the ratio dx/dr is constant if the carrier plane is at a fixed angle to the magnet face, they need not be parallel as shown in FIG. 1.

It should also be noted that the ratio x/R can be considered a constant even for a broad beam entering the magnet provided that the beam profile in the x direction be symmetric and that the centroid, that is, the mean position satisfy Equation 7.

It should also be noted that the final acceleration lens 18 can be an inverting compound electrostatic lens which transforms the ray emerging from point 11 to position 23 and the ray emerging from point 12 into position 22. If such a lens is used then the center axis A of the disc 20 must be on the opposite side from that shown (i.e. axis of rotation 21 must be spaced to the right of wafer 19, shown in the figure, the same distance as the centroid of the beam 7 is to the left of the wafer); such a geometry may have practical advantages. In the presently preferred embodiment, however, the axis of rotation is aligned with the centroid of the beam entering the magnet and a non-inverting acceleration lens is used.

Also we note that it is not necessary to have a demodulation lens 14 and the gap which that implies in order to produce ions of constant energy impinging on the wafers. The energy of the beam may be made constant by modulating the post-acceleration lens 18 with the sample amplitude but with opposite phase to that of the modulator, both modulator 3 and post-accelerator 18 acting as accelerators at all times. This is illustrated schematically in FIG. 3, described below.

EMBODIMENT OF FIG. 2

Referring now to FIG. 2, the embodiment of FIG. 1 is adapted for implantatin of 8 inch wafers held on a 48 inch diameter spinning disc. These dimensions correspond to those used in the NV20 ion implanter, the latest model at Eaton Corporation, and the one used for implanting the largest wafers presently in production. We further assume that arsenic, of mass 75 and unit charge, +1, is to be implanted into the silicon wafers at 200 keV of energy. These parameters represent the most difficult tests for present ion implanters. A schematic of the essential elements is shown in FIG. 2. The entire system is assumed to be under vacuum according to standard practice.

Fixing the wafer dimension, fixes the magnet deflection. To scan an 8 inch wafer with a one inch diameter beam requires a total deflection of 9 inches so as to overscan the edges. If we place the wafers at a mean radius of 19.5 inches from the center of the disc, we can implant 13 wafers at one loading. The wafers on the disc have a minimum radius of 15.5 inches and a maximum radius of 23.5 inches. Thus the minimum diameter of the magnetic deflection must be 15 inches and the maximum must be 24 inches; that is x(min), the distance from point 7 to point 11 must be 15 inches and the distance from point 7 to point 12 must be 24 inches.

If we fix the magnetic field at 1 Tesla, a reasonable value for a gap which need not be more than 2 inches, then Equation 3 gives us the minimum and maximum energies of the arsenic ions entering the magnet at point 7. The minimum energy is 23.5 kev and the maximum energy is 60 keV, resulting in magnetic radii of 7.5 inches and 12 inches respectively, or a net scan of 2(12−7.5)=9 inches.

The energy of the ion beam entering the modulation gap will therefore be 23.5 keV and the total modulation of the voltage will have an excursion of 60 keV minus 23.5 keV or 36.5 keV.

A 23.5 keV source system is well within the standards of the industry. The source system 1 would consist of an ion source 24, in which ions are extracted at a potential of 25.5 keV; a small 2 keV deceleration voltage 25 is used to suppress the electrons in the source. The resulting beam of 23.5 keV is analysed by the magnet 26 to produce a pure beam of homogeneous ions for input into the modulation gap 3.

Figure 4:
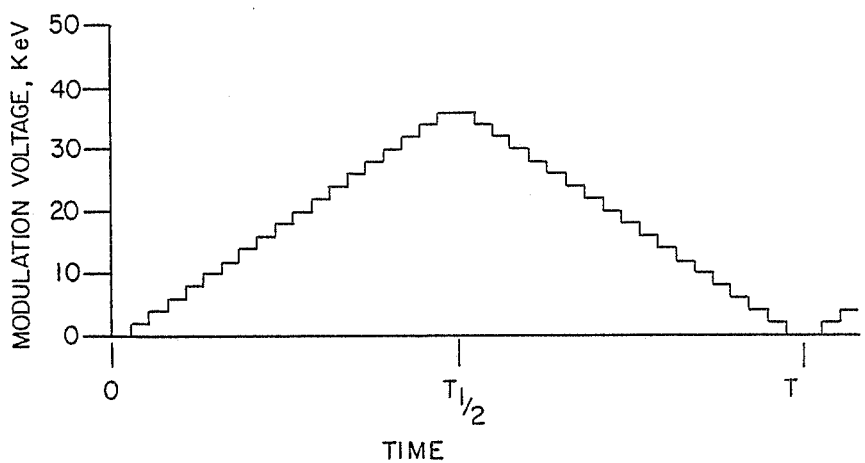
FIGS. 4, 4a and 4b represent wave forms, respectively, of modulation voltage plotted against time and against energy, and implant density plotted with respect to corresponding deflection distance.

At this gap the energy of the beam is modulated by variable voltage source 27. The excursion time for a back-forth radial scan will depend on the size of the beam, the disc rotation frequency, and the number of revolutions desired per radial increment of beam diameter. The overall criterion is the need for a desired uniformity of implant. Typical numbers for present implanters are in excess of ten revolutions of the disc for every radial increment of one beam diameter. If we assume a beam diameter of 1 inch, and a disc frequency of 1000 rpm, both nominal values for present implanters, then we have 10 revolutions in 0.01 minute, and need a radial speed of 1 inch per 0.01 minutes. Thus a full back-forth scan of 18 inches will take 0.18 minutes or 10.8 seconds. This is to be compared with typical mechanical scan rates of more than a minute per back-forth scan. Although advantageously much faster (e.g. for better uniformity of dose) than typical mechanical scan rates, the modulation can be done quite slowly from the point of view of electromagnetic devices and permits use of a stepped voltage profile such as is shown in FIG. 4. For illustration purposes we show the steps applied by variable voltage source 27 as being 2 keV, but in practice one would use a stepping voltage of only a few hundred volts to produce a beam displacement on the wafer of about 0.1 inches per disc revolution. The total power into the scanning system is small even for intense beams, and, in any case, most of this power is extracted back out of the system during the deceleration phase.

Figure 4A:
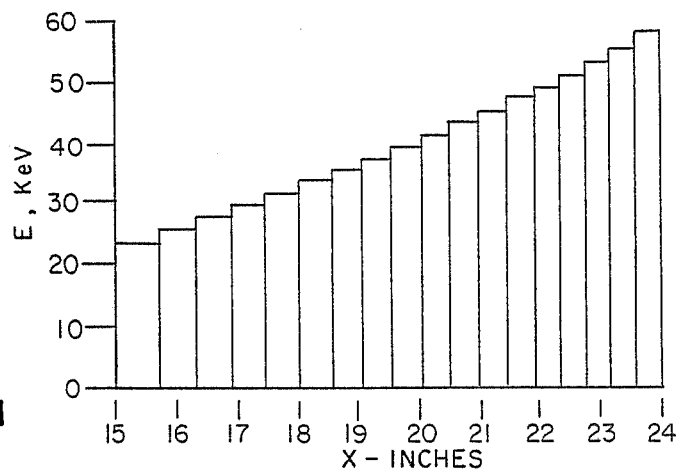

The beam will exit from the magnet in a back and forth scan in which the beam moves a smaller increment per unit time when at the larger values of x than it does at the smaller values of x. To show this relationship we consider the results of the modulated voltage specimen of FIG. 4 with voltage increments of 2 keV. In FIG. 4a, the energy of each beam is plotted as a function of the distance from the magnet entry point, x, for the parameters of the illustrative embodiment. The smaller linear increments per unit of time imply a greater current density. This is shown explicitly in FIG. 4b where the inverse of the increments in x, labelled as dN/dX, the particles per unit length, is plotted as a function of the exiting distance x.

The electrodes of the demodulation gap 14 have an elliptical profile, about 10 inches by 2 inches; the gap size can be less than 1 inch. The beam exiting from the demodulation gap will have a constant energy of 23.5 keV.

The post-acceleration lens present a special design problem, since this lens must accelerate each beam by 176.5 keV to produce a 200 keV implant and it must do so without focusing in the scan direction. On the other hand, any designer of a high-energy implanter must face the problem of designing a special acceleration lens and there are no fundamental problems to doing so. The design is straightforward to those experienced in the field since the lens is long and narrow and such lenses inherently have little focus in the long direction. It is also worth noting that since the beam is being scanned slowly back and forth across the acceleration gap, one can add features which cannot be considered in more conventional acceleration systems; in particular, it is practical to consider putting in a time-dependent correction lens if there is distortion of the beam in the acceleration tube as a function of the sweep position.

Figure 4B:
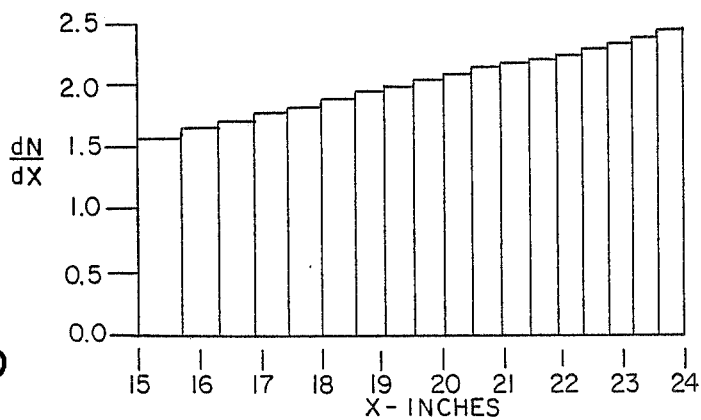

It is instructive to look at the actual numbers for the scanning profiles shown in FIGS. 4, 4a, and 4b, using the parameters of the illustrative embodiment and assuming an arsenic current of 10 milliamperes in the one inch beam. In Table 1, we show in successive columns as a function of the arsenic energy into the magnet, the distance x (equivalent to twice the bending radius), the increment in x between successive increments in energy, the inverse of those increments, the latter being directly proportional to the density of the ions leaving the magnet into space B. The last column is the dose per square inch during one pass which is directly proportional to the product of the increments in x, column 3, times the weighted mean value of the x values of column 2 for that increment. The values of column 4 are directly proportional to the density of the ions emerging from the magnet. Multiplying this measure of particle density by the mean value of x is equivalent to multiplying the particle density by the radius value of the wafer on the disc. Column 5 is the foremdentioned product multiplied by the appropriate constants for the parameters used in this illustration to yield the expected density of ions implanted per square inch in a single scan of the wafer. The constancy of the values of column 5 is a test of the essential idea of this aspect of the invention. The method does indeed compensate for variations due to radial changes on the rotating disc.

TABLE 1

| 1<br>E<br>KeV | 2<br>X(E)<br>inches | 3<br>$X(E_i) -$<br>$X(E_{i-1})$<br>inches | 4<br>$[X(E_i) - X(E_{i-1})]^{-1}$<br>1/(inches) | 5<br>dN/dA<br>IONS/<br>square inch |
|---|---|---|---|---|
| 23.5 | 15.1 | | | |
| 25.5 | 15.7 | 0.628 | 1.591 | $2.95 \times 10^{14}$ |
| 27.5 | 16.3 | 0.604 | 1.655 | 2.95 |
| 29.5 | 16.89 | 0.583 | 1.716 | 2.95 |
| 31.5 | 17.455 | 0.563 | 1.776 | 2.95 |
| 33.5 | 18.00 | 0.546 | 1.833 | 2.95 |
| 35.5 | 18.530 | 0.530 | 1.888 | 2.95 |
| 37.5 | 19.045 | 0.515 | 1.942 | 2.95 |
| 39.5 | 19.546 | 0.501 | 1.992 | 2.95 |
| 41.5 | 20.035 | 0.489 | 2.046 | 2.95 |
| 43.5 | 20.512 | 0.477 | 2.096 | 2.95 |
| 45.5 | 20.978 | 0.466 | 2.145 | 2.95 |
| 47.5 | 21.434 | 0.456 | 2.193 | 2.95 |
| 49.5 | 21.881 | 0.447 | 2.239 | 2.95 |
| 51.5 | 22.318 | 0.438 | 2.285 | 2.95 |
| 53.5 | 22.748 | 0.430 | 2.327 | 2.95 |
| 55.5 | 23.169 | 0.421 | 2.374 | 2.95 |
| 57.5 | 23.583 | 0.414 | 2.417 | 2.95 |
| 59.5 | 23.989 | 0.406 | 2.461 | 2.95 |

EMBODIMENT OF FIG. 3

Figure 3:
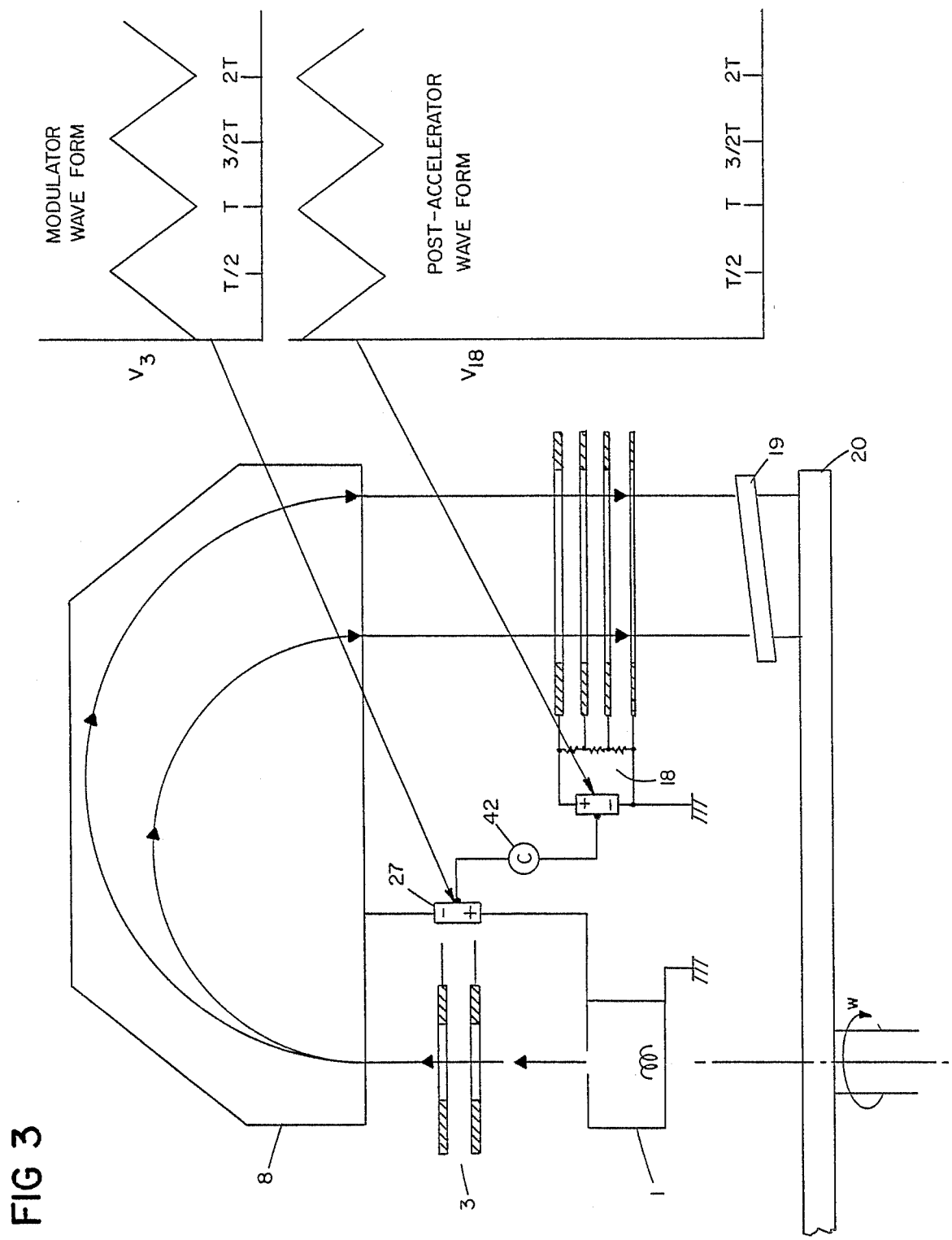
FIG. 3 shows another implementation of a spinning disc implanter.

We refer now to FIG. 3 which employs a post accelerator and no decelerator. We assume an energy of 24 keV from the ion source and a desired energy of 200 keV for the implanted ions. We further assume for illustration that the modulation voltage form is a symmetric triangle wave whose amplitude varies from zero to 36 keV. The acceleration voltage on the post-accelerator 18a varies with the same triangular wave form as shown in FIG. 3, but with opposite phase so that the voltage excursion is from 176 keV to 140 keV. Specifically, when the modulator 3 has zero voltage, the ions enter and leave the magnet with an energy of 24 keV and get further accelerated by 176 keV by the post accelerator 18a. When the modulator 3 is at 36 keV, the ions enter and leave the magnet with an energy of 60 keV (24 keV + 36 keV) and get further accelerated by 140 keV by the post-accelerator 18a. By tracking the wave forms on the modulator and post-accelerator together with the same period, using a common control circuit 42, one ensures that the particles in the beam being implanted into the wafer will always have a uniform energy of 200 keV.

A disadvantage of this scheme is that one needs to vary the voltage of both the modulator and the post-accelerator when they are under load, rather than, as in FIGS. 1 and 2, vary the voltage of the modulator and demodulator which are under no load when coupled together. There are however compensating advantages to the scheme shown in FIG. 3: First, one reduces the system by one component with attendant savings in space and hardware. Second, the demodulator gap, which here need not be employed, is a potentially strong source of damaging x-ray radiation, just as are the modulator and post-accelerator. Third, each of the gaps is a region of unneutralized beam, since the neutralizing electrons in the beam are swept out by the positive potentials at the gaps. Thus, each of the gaps results in beam spreading, so-called beam blow-up, which can be severe if intense ion beams are used. For this reason, getting rid of the demodulator gap may well offset the technical disadvantage of dealing with modulated gaps under load.

EMBODIMENT OF FIG. 5

Figure 5:
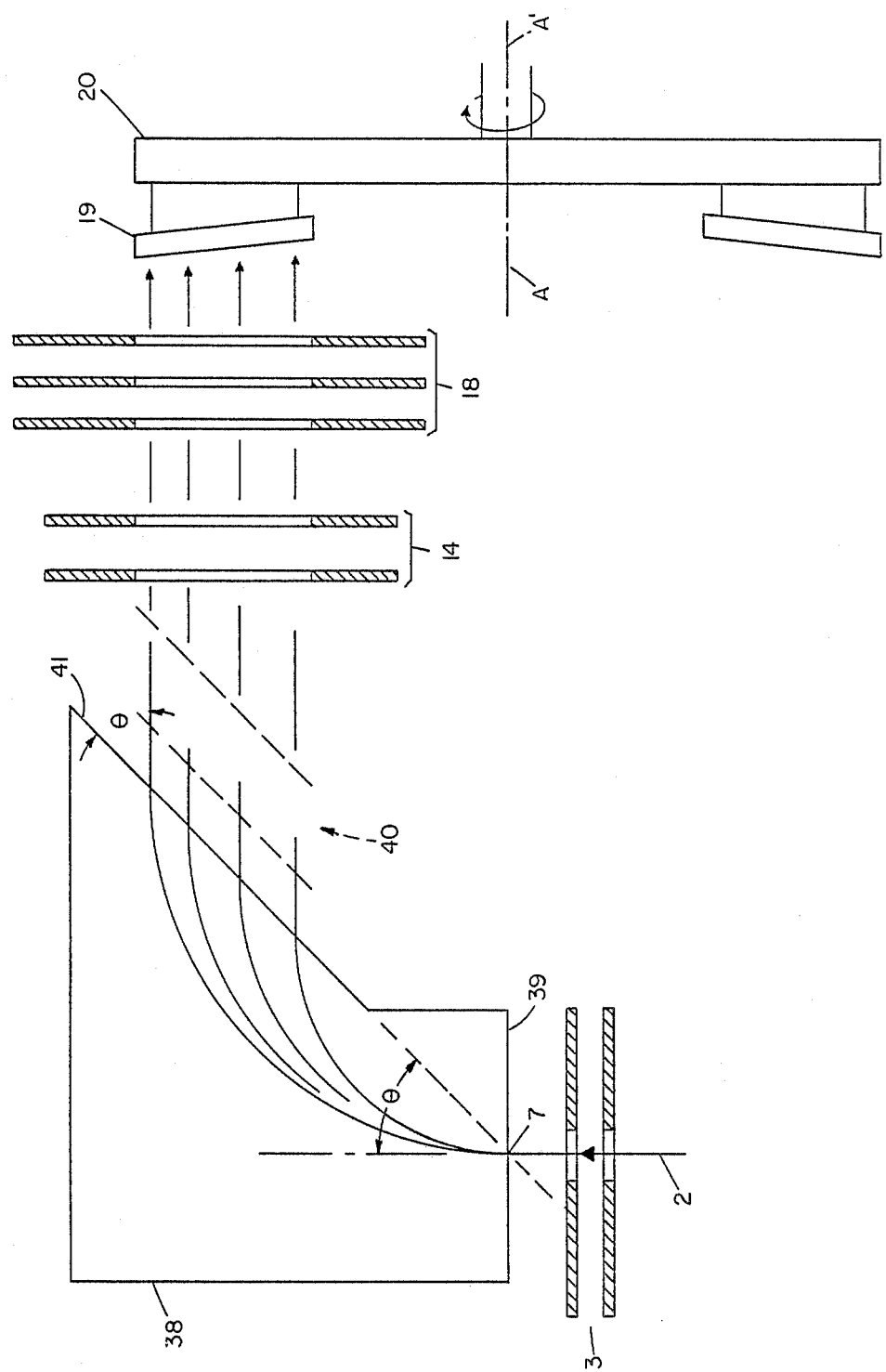
FIG. 5 is a diagram of an embodiment employing an analyzer magnet which bends the paths of the ions less than 180°.

It should be noted that to enjoy benefits of the invention (e.g. essentially parallel ion trajectories into the target and uniformity of particle density per unit area) the deflection angle of the beam in the analyzer magnet need not be 180° as has been used in the preceding embodiments. First, the needs of an industrial implanter may be satisfied with angular deflections of, for example, 170° if, even when ion beams of finite width are used, the resulting deviations from parallelism of the ions implanted into the wafer do not produce non-uniformities which exceed tolerance limits. Second, analyzing magnet systems following energy modulation can be designed which produce a bending much smaller than 180°, the deflection being proportional to $E^{\frac{1}{2}}$ (Equation 3) while preserving, to a good approximation, the requirement that all ions move essentially parallel to each other when impinging on the wafer. That is, while the preferred embodiment of a 180° magnet deflection is unique in preserving the parallelism of ion trajectories of beams of finite width, other designs may approximate the needs of industry with possible savings and cost. To preserve the constancy of the dose per unit area on the workpiece, the voltage modulation will have to be tailored, according to Equation 11, for the magnet design used. One possible example is shown in FIG. 5. The beam of ions 2 is assumed to enter the magnet 38 at point 7, perpendicular to the magnet face 39, as before. The exit face 41 of the magnet is at an angle $\theta$ with respect to the direction of the beam 2; the plane of the magnet face 41 passes through point 7. The total deflection in the analyzing magnet 38 is $2\theta$, and rays, of different energy entering at point 7, emerge parallel to one another at an angle of $\theta$ with respect to the magnet face 41. It should be recognized that FIG. 5 represents a generalization of the scheme of FIGS. 1, 2, and 3 (in which $\theta$ equals 90, all rays exit at 90° from the magnet face, and the total deflection is 180°).

Unlike the case of the 180° magnet, under such conditions, a beam of finite width entering the magnet face with beam centroid at point 7 results in a diverging beam emerging from the magnet face (though it will be appreciated that in the present state of the art the widths of the ion beams may be made so small as to result in negligible divergence from parallelism). Moreover, the fringe field acts as a sector lens on the ions, causing ions of different energies, even though they exit in parallel paths, to have different asymptotic direction. If the resulting divergence from parallelism is unacceptable for obtaining the desired uniformity of dose on the workpiece, it may be possible to compensate for the non-parallelism by the addition of an optical system, 40, shown as dotted lines. Also shown schematically for illustrative purposes, are a demodulator 14, a post-accelerator 18, and a wafer 19 on a rotating disc. The axis A—A' of the rotating disc points to the entrance point 7 as in FIGS. 1 and 2.

OTHER ROTATING EMBODIMENTS

In other embodiments, for instance, the rate of voltage scan on modulator 3 can be chosen from a wide range of speeds, including sweep speeds that are very fast, and the speed of mechanical scan in the orthogonal direction can be markedly decreased from that mentioned in the above embodiments.

In other embodiments, instead of a spinning disc, a generally planar conveyer can be employed, which at the region of implant, turns about a circular arc, the center of which is aligned according to the same principles as employed for the disc described above.

X-Y SCANNING, EMBODIMENT OF FIG. 6

Indeed, it should also be noted that the complete scan of an ion beam on a semiconductor wafer may be accomplished by applying the technique of magnetic scanning of an energy-modulated beam twice in succession so that both orthogonal motions needed to obtain a uniform implant dose are accomplished by electromagnetic scanning of a beam of ions which are implanted at a fixed angle into the workpiece. In this use of the basic invention there would be no mechanical motion while the wafer is being implanted. The essentials of the orthogonal magnetic scanning are illustrated in FIG. 6 with two independent 180° systems. The first stage of the scan is the same as described above. It consists of an ion source 1 and a voltage modulator 3 to modulate the energy of the ion beam 2 which enters the magnet 8 at a fixed mean point 7. The beam exits from the magnet 8 into region 13 at positions which scan a range from point 11 to point 12 as determined by the parameters of the magnetic and ion energy. The second, independent stage of scanning, employs a second modulator 29 followed by a second scanning magnet 30. The magnetic field gap 31 of magnet 30 must be orthogonal to that of the magnetic gap 28 of magnet 8 and the gap of magnet 30 must be wide enough to encompass the full scan from point 11 to point 12 of the ion beam of finite size. The voltage range impressed on the modulator 29 is such that the scan produced in magnet 30 has the desired range of spatial values. It is then straightforward to arrange the modulation wave forms and values so as to produce a scan over the full face of a wafer placed under the scanning beam exiting from magnet 30, for example, the raster scan 36 produced by modulation ranges such that when the ions are deflected to position 11 by magnet 8, they are further scanned from position 34 to 35 by magnet 30, and when the ions are deflected to position 12 by magnet 8, they are further scanned from positions 33–32 by magnet 30, see FIG. 6a.

For the ion beam exiting from magnet 30 to implant a wafer with a uniform dose we further require that the voltage wave forms on modulators 3 and 29 have a special time dependence, as discussed above, namely that the time spent at each voltage vary as the square root of that voltage.

To obtain ions of higher energy than exit from magnet 30, it is necessary to have a post-accelerator 18 as before. This post accelerator will have an oval or circular gap large enough to accept the full two dimension scan of the beam.

The energy of the ions exiting from the magnet 30 has been modulated twice, producing a scan 36. In the illustration above, the total energy variation during the full scan of a wafer will not exceed the maximum energy added by the first modulator 3. To obtain a homogeneous energy of the ions implanting the wafer one again has two choices. The first choice is to demodulate the energy with a demodulation gap 14; the deceleration in the gap must precisely track the sum of the accelerations in modulator 3 and modulator 29. The second choice is to vary, as a function of time, the amount of acceleration in the post-acceleration stage 18 so that the algorithmic sum of all accelerations is a constant independent of time.

The optic design of the post-accelerator alone or the post-accelerator and the demodulator can be implemented in a manner to result in an inverted (or even a non-inverted) image of the rays exiting from the magnet 30 to correct distortion or the post-accelerator may be followed by a time-dependent correction lens system to correct distortion introduced by the post accelerator.

It should be noted that FIG. 6 is an illustration of just one possible arrangement to achieve a full two-dimensional scan using the invention. Orthogonal scans in which each of the orthognal bends of the ion paths is considerably less than 180° are possible. In particular, orthogonal scans in which each bend is 90° (as illustrated in FIG. 5 for a scan in one direction) could effect a considerable saving in magnet size.

For simplicity of explanation, the embodiments shown herein employ a source of a single specie. In practce ion sources usually emit multiple species and a source analyzer, usually magnetic, is used to select the one specie desired. In practice one may use a separate analyzing magnet prior to the scanning magnet described though under special conditions it may be possible to use the same magnet both for selection of the specie and for scanning.

We claim:

1. In an ion implanter having an ion beam source and a scanning device disposed in a beam line between the source and an implant target, said scanning device serving to cause a spatial distribution across the target of the ions being implanted, said scanning device comprising a beam energy modulator means provided with a source of modulating voltage having a cyclical wave form to modulate the energy of the ions of the beam over time, and an analyzer magnet means disposed after said modulator means in position to act upon the thus modulated ion beam to cause displacement of the beam in a repetitively scanned pattern, the improvement wherein, under conditions of operation in which the intensity of said ion beam is unchanging, said wave form of said modulating voltage is preselected to take into account the non-linear relationship between the deflection of said beam by said magnetic means and the modulation of the energy of said beam, so as to produce a uniform areal distribution of the number of ions implanted into the target.

2. The ion implanter of claim 1 wherein said analyzer magnet means is constructed to produce a substantially constant and uniform magnetic field across the path of the ions through said magnet means, with flux lines extending substantially parallel to each other and perpendicular to the axis of the entering ion beam and said preselected wave form takes into account that the areal density of the ions of said beam in said scanned pattern is directly proportional to the amount of displacement of the beam from a reference position in said pattern.

3. The ion implanter of claim 1 wherein said analyzer magnet means is constructed so that the paths of the ions constituting the beam enter the entrance face of said magnet means at a fixed region and are bent by said magnet means through a predetermined arc selected so that ions of every energy emerge from said magnet means along substantially parallel paths.

4. The ion implanter of claim 1, 2 or 3 wherein the paths of ions of the beam are bent by said magnet means through an arc of about 180° and the ions emerge from said magnet means along parallel paths which are substantially perpendicular to the exit face of said magnet means.

5. The ion implanter of claim 1, 2, or 3 wherein the paths of the ions constituting the beam are bent by said magnet means through an arc substantially less than 180° and the ions emerge from said magnet means along paths which form an acute angle to the exit face of said magnet means.

6. The ion implanter of claim 5 wherein a projection of the plane of the exit face of the magnet means passes through the entry point of the centroid of said beam into said magnet means with the result that ion trajectories of different energy, which enter the magnet means at said point, emerge from said magnet means along essentially parallel paths.

7. The ion implanter of claim 1, 2 or 3 including means to move said target during the scanning of said beam, wherein said preselected wave form takes into account the dependence of the areal density of the ions being deposited on the implant target upon the position and motion of the target with respect to the beam position exiting from the magnet means.

8. The ion implanter of claim 1, 2 or 3 wherein a target carrier is arranged to carry said implant target through the beam, the path of said carrier describing a circular arc about an axis, said scanning device and carrier being cooperatively related to orient the scanning motion of said beam upon said carrier in the direction of the radius, R, of the arcuate motion of said carrier, and said wave form, in addition to taking into account the non-linear relationship between the deflection of the energy-modulated beam by said magnet means, simultaneously takes into account the 1/R dependence of the circumferential area of the target.

9. The ion implanter of claim 8 wherein the axis of said carrier is parallel to a line projected substantially through the point where the beam enters said analyzer magnet means and the source of modulating voltage has the wave form of a voltage ramp in which $dV/dt = x(D-x)$ where V is voltage, t is time, x is the distance between the entrance and exit points of the beam relative to the magnet means and D is the distance from said carrier axis to the point of entry on said magnet means of the centroid of said beam so as to produce an implant into a workpiece of high spatial uniformity.

10. The ion implanter of claim 9 wherein said carrier carries the implant target under the scanned beam in the arc of a circle whose center line projects substantially through the point at which the modulated beam enters the analyzer magnet means so that the value of D is zero and the source of modulating voltage has the wave form of a voltage ramp in which $dV/dt$ is constant, where V is voltage and t is time, so as to produce an implant into the workpiece of high spatial uniformity.

11. The ion implanter of claim 9 wherein said wave form increases in equal step-wise voltage increments in equal lengths of time.

12. The ion implanter of claim 8 wherein means are provided to invert the beam from said magnet means.

13. The ion implanter of claim 12 constructed according to claim 9, the axis of said carrier being parallel to a line projected substantially through the point where said beam enters said analyzer magnet means and is displaced therefrom said distance D on the opposite side of said beam.

14. The ion implanter of claim 8 wherein said carrier for moving said target comprises a rotating disc.

15. The ion implanter of claim 1, 2 or 3 wherein the implant target has neither a velocity nor an acceleration component in the direction of the scan of said beam and the said source of modulating voltage has the wave form of a voltage ramp in which increments of voltage, in equal increments of time, vary as the square root of the voltage.

16. The ion implanter of claim 15 wherein the implant target is stationary under said beam during the implantation.

17. The ion implanter of claim 16 wherein said source of modulating voltage has the wave form of a voltage ramp in which $dV/dt = CV^{\frac{1}{2}}$ within the limits of $V_{min}$ and $V_{max}$, where V is voltage, t is time and C is a constant, to produce a uniform areal distribution of the number of ions implanted into said stationary target.

18. The ion implanter of claim 1, 2 or 3 in which said wave form is selected to compensate for the position of said implant target with respect to said entrance point of said beam into said magnet means.

19. The ion implanter of claim 1, 2 or 3 in which said wave form is selected to compensate for the relative motion of said implant target with respect to the position of said beam on said target.

20. The ion implanter of claim 1, 2 or 3 in which said wave form is selected to compensate for the orientation of the plane of said implant target with respect to said beam position on said target.

21. The ion implanter of claim 1, 2 or 3 including two analyzer magnet means set orthogonally to one another, each associated with a respective energy modulating means which precedes it, the ion beam exiting the first of said magnet means entering the second of said magnet means, said two magnet means and associated energy modulation means producing a scan of said beam in two orthogonal coordinates.

22. The ion implanter of claim 1, 2 or 3 including means for exposing semiconductor wafer targets to said beam for the production of electronic circuits, said ion beam source being preselected to produce ions of a specie desired to be implanted in said semiconductor wafer targets.

23. In a method of implanting ions into an implant target comprising (a) producing an ion beam and (b) scanning the beam to provide a spatial distribution across the target of the ions being implanted, including:
   scanning the beam by modulating the beam with a source of modulating voltage having a cyclical wave form to modulate the energy of the ions of the beam over time,
   and passing the thus-modulated ion beam through an analyzing magnetic field selected to cause a scanning motion of the beam dependent upon said modulating voltage wave form,
   wherein the intensity of the ion beam is maintained substantially constant in time, said analyzing magnetic field is maintained substantially constant in time and uniform across the path of the ions through said field, with flux lines extending substantially parallel to each other and perpendicular to the axis of the entering ion beam, and the wave form for said modulating voltage is preselected to take into account the non-linear relationship between the deflection of said beam by said magnetic field and the modulation of the energy of said beam.

24. The ion implantation method of claim 23 wherein the preselected wave form of said modulation of the beam energy takes into account conditions of operation to produce a uniform distribution of the number of ions implanted over the area of said target.

25. In an ion implanter having an ion beam source and a scanning device disposed in a beam line between the source and an implant target, said scanning device serving to cause a spatial distribution across the target of the ions being implanted, said scanning device comprising
   a beam energy modulator means provided with a source of modulating voltage having a cyclical wave form to modulate the energy of the ions of the beam over time,
   and an analyzer magnet means disposed after said modulator means in position to act upon the thus modulated ion beam to cause displacement of the beam in a repetitively scanned pattern,
   a target carrier arranged to carry said implant target through the beam, the path of said carrier describing a circular arc, said scanning device and carrier being cooperatively related to orient the scanning motion of said beam upon said carrier in the direction of the radius of the arcuate motion of said carrier,
   said carrier arranged to carry the implant target under the scanned beam in the arc of a circle whose centerline projects substantially through the point at which the modulated beam enters the analyzer magnet means,
   said wave form of said modulating voltage being preselected to take into account the non-linear relationship between the deflection of said beam by said magnet means and the modulation of the energy of said beam and the dependence of the areal density of the ions being deposited on the implant target upon the position and motion of the target with respect to the beam position exiting from the said magnet means so as to produce an implant into a workpiece of high spatial uniformity.

26. The ion implanter of claim 25 wherein said carrier for moving said target comprises a rotating disc.

27. In an ion implanter having an ion beam source and a scanning device disposed in a beam line between the source and an implant target, said scanning device serving to cause a spatial distribution across the target of the ions being implanted, said scanning device comprising a beam energy modulator means provided with a source of modulating voltage having a cyclical wave form to modulate the energy of the ions of the beam over time, and an analyzer magnet means disposed after said modulator means in position to act upon the thus modulated ion beam to cause displacement of the beam in a repetitively scanned pattern a target carrier arranged to carry said implant target through the beam, the path of said carrier decribing a circular arc, said scanning device and carrier being cooperatively related to orient the scanning motion of said beam upon said carrier in the direction of the radius of the arcuate motion of said carrier, and means are provided to invert the beam from said magnet means and the axis of said carrier is parallel to a line projected substantially through the point where said beam enters said analyzer magnet means and is displaced therefrom an equal distance on the opposite side of said beam, said wave form of said modulating voltage being preselected to take into account the non-linear relationship between the deflection of said beam by said magnet means and the modulation of the energy of said beam and the dependence of the areal density of the ions being deposited on the implant target upon the position and motion of the target with respect to the beam position exiting from the said magnet means so as to produce an implant into a workpiece of high spatial uniformity.

28. The ion implanter of claim 27 wherein said carrier for moving said target comprises a rotating disc.

29. The ion implanter of any of the claims 25 through 28 wherein said source of modulating voltage has the wave form of a voltage ramp in which dV/dt is constant, where V is voltage and t is time.

30. The ion implanter of claim 29 wherein said wave form increases in equal step-wise increments in equal lengths of time.

31. In an ion implanter having an ion beam source and a scanning device disposed in a beam line between a stationary source and a stationary implant target, said scanning device serving to cause a spatial distribution across the target of the ions being implanted, said scanning device comprising a beam energy modulator means provided with a source of modulating voltage having a cyclical wave form to modulate the energy of the ions of the beam over time, and an analyzer magnet means disposed after said modulator means in position to act upon the thus modulated ion beam to cause a displacement of the beam in a repetitively scanned pattern, said source of modulating voltage has the wave form of a voltage ramp in which $dV/dt = CV^{\frac{1}{2}}$ within the limits of $V_{min}$ and $V_{max}$, where V is voltage, t is time and C is a constant, there being two said analyzer magnet means set orthogonally to one another, each associated with a respective energy modulating means which precedes it, the ion beam exiting the first of said magnet means entering the second of said magnet means, said two magnet means and associated energy modulation means producing a scan of said beam in two orthogonal coordinates to produce a uniform areal distribution of the number of ions implanted into said stationary target.

32. The ion implanter of claim 31 wherein, said analyzer magnet means is constructed so that the paths of the ions constituting the beam enter the entrance face of said magnet means at a fixed region and are bent by said magnet means through a predetermined arc selected so that ions of every energy emerge from said magnet means along substantially parallel paths.

33. The ion implanter of claim 32 wherein the paths of ions of the beam are bent by said magnet means through an arc of about 180° and the ions emerge from said magnet means along parallel paths which are substantially perpendicular to the exit face of said magnet means.

34. The ion implanter of claim 32 wherein the paths of the ions constituting the beam are bent by said magnet means through an arc substantially less than 180° and the ions emerge from said magnet means along paths which form an acute angle to the exit face of said magnet means and wherein a projection of the plane of the exit face of the magnet means passes through the entry point of the centroid of said beam into said magnet means with the result that ion trajectories of different energy, which enter the magnet means at said point, emerge from said magnet means along essentially parallel paths.

35. The ion implanter of claim 32, 33 or 34 wherein said analyzer magnet means is constructed to produce a substantially constant and uniform magnetic field across the path of the ions through said magnet means, with flux lines extending substantially parallel to each other and perpendicular to the axis of the entering ion beam and said wave form is selected to take into account that the areal density of the ions in the scanned beam is directly proportional to the amount of said displacement.

* * * * *

UNITED STATES PATENT AND TRADEMARK OFFICE
CERTIFICATE OF CORRECTION

PATENT NO. : 4,804,852
DATED : February 14, 1989
INVENTOR(S) : Peter H. Rose et al.

It is certified that error appears in the above-identified patent and that said Letters Patent is hereby corrected as shown below:

Col. 4, line 5: "he" should be --the--;

Col. 4, line 51: "trajectores" should be --trajectories--;

Col. 5, line 21: "invese" should be --inverse--;

Col. 5, line 55: "(1/2πr)" should be --(1/2$^{\pi}$r)--;

Col. 6, line 15: "2πr" should be --2$^{\pi}$r--;
ALSO: For consistancy, first "k" should be italicized.

Col. 6, line 16: "2πk$_1$" should be --2$^{\pi}$k$_1$--;

Col. 6, line 26: "dn/dA" should be dN-dA--;

Col. 8, line 39: "implantatin" should be --implantation--;

Col. 9, line 49: "specimen" should be --spectrum--;

Col. 13, line 54: "practce" should be --practice--;

Col. 14, line 10: "magnetic" should be -- magnet --;

Col. 15, line 6 : "x(D-x)" should be --x/(D-x)--;

Col. 17, line 21: "decribing" should be --describing--.

Signed and Sealed this

Twenty-ninth Day of August, 1989

Attest:

DONALD J. QUIGG

Attesting Officer

Commissioner of Patents and Trademarks